United States Patent [19]

Hinterlechner et al.

[11] Patent Number: 5,386,620
[45] Date of Patent: Feb. 7, 1995

[54] PUNCHING AND SHAPING MACHINE TOOL WITH CAM GEAR

[75] Inventors: Gerhard Hinterlechner, Pforzheim; Ulrich H. Gäbel, Neuenbürg, both of Germany

[73] Assignee: AATEC Assembling Automations Technik GmbH, Pforzheim, Germany

[21] Appl. No.: 182,139

[22] PCT Filed: Jun. 27, 1992

[86] PCT No.: PCT/EP92/01449

§ 371 Date: Jan. 14, 1994

§ 102(e) Date: Jan. 14, 1994

[87] PCT Pub. No.: WO93/02539

PCT Pub. Date: Feb. 4, 1993

[30] Foreign Application Priority Data

Jul. 16, 1991 [DE] Germany .................. 4123512

[51] Int. Cl.6 .................. B23P 23/00; B21F 1/00
[52] U.S. Cl. .................. 29/566.3; 72/452; 83/602; 140/105
[58] Field of Search .................. 29/566.2, 566.3, 33 M; 140/105, 147, 140; 72/184, 452; 83/602, 628

[56] References Cited

U.S. PATENT DOCUMENTS

| 3,886,829 | 6/1975 | Criblez | 83/628 X |
| 4,371,012 | 2/1983 | Weresch | 140/105 |
| 4,497,196 | 2/1985 | Bakermans et al. | 72/452 |
| 4,845,833 | 7/1989 | Weresch | 29/566.3 |

FOREIGN PATENT DOCUMENTS

| 1023895 | 3/1953 | France | 72/452 |
| 266530 | 4/1989 | German Dem. Rep. | 83/602 |
| 683864 | 9/1979 | U.S.S.R. | 83/602 |

Primary Examiner—William Briggs
Attorney, Agent, or Firm—Dvorak and Traub

[57] ABSTRACT

The machine tool has a frame (10) and in it, a cam gear with two pairs of cam tracks with complementary cam shapes. The tool actuation takes place by means of two levers (3a, 3b) which are hinged to the side on a clamping plate (8). Each of these levers has two rollers (4a, 6a; 4b, 6b) on one of its arms and these are coupled positively to one cam track pair each. The position of different cam tracks is matched in a certain way with the objective of reducing the frequency of disturbing vibrations.

42 Claims, 8 Drawing Sheets

PUNCHING AND SHAPING MACHINE TOOL WITH CAM GEAR

FIELD OF THE INVENTION

The invention is based on a machine tool with the features given in the preamble to claim 1.

STATE OF THE ART

Such a machine is known from DE-PS 35 44 087. In the known machine, the tools are driven by a cam gear which has two driven cam plates located on the same axis. A freely rotating roller is in contact with the circumferential area, designed as the cam track, of each of the two cam plates. Each of the two rollers is supported at the end of a two-arm lever which transmits the deflection of the roller caused by the rotating cam track to a tool half, or to a holder for it, which is located at the opposite end of the lever. The two levers are connected together by a tie-rod on whose ends the two levers are pivotably supported.

So that the rollers remain continuously in contact with the cam plates, they are pressed or pulled by frictional connection onto the cam track formed by the circumferential surface of the cam plate; this is generally effected by springs. The preload forces applied by the springs must be larger than the forces arising during the acceleration and braking of the tools in order to ensure that the rollers do not lift from the cam plates. A disadvantage of these preloading forces, on the other hand, is that they make the drive more difficult because they have to be overcome when the tools are driven so that a correspondingly strong and heavy driving motor is required. Another disadvantage arises from the fact that the torque to be provided by the driving motor for the actual operating process carried out by the tools is increased by the torque which is required to overcome the preloading forces acting on the rollers; in consequence, the response threshold of an overload clutch provided in the drive train to protect the tools from damage in the case of overload has to be increased in an undesirable manner. Another disadvantage consists in the fact that a device for preloading the rollers by springs prevents a displacement of the lever, desirable per se, parallel to the driving shaft of the cam plate; such a displacement capability is desirable to adapt the machine tool for different operational tasks.

In order to avoid the preloading forces, it is known art to guide the roller in a groove on the cam plate (grooved cam gear) or to guide a pair of rollers on both sides of a bead on the cam plate (beaded cam gear) instead of on the circumferential surface of the cam. For the same follower motions as those of a cam gear in which the roller runs externally on the circumferential surface of the cam plate, however, grooved cam plates and beaded cam plates have a larger diameter so that larger inertia torques appear in the cam gear. This is undesirable because the machine can only be stopped more slowly or the driving forces and braking forces become larger and wear increases. The acceleration and braking forces of the tool halves and the clamping devices carrying them generally appear in the direction of the tool motion. They are particularly disadvantageous in the case of a rapid reversal of acceleration because the inertia forces due to the tools and gear elements appearing in the direction of the tool motion excite the machine frame and the work-piece holder to vibrations, in some cases at a high excitation frequency. In order to counter the excitation of vibration, it is known art to displace the apex of the reversal of acceleration in the direction of the starting acceleration so that the braking deceleration is reduced—but with the disadvantage that the starting acceleration is increased.

In DE-PS 35 44 087, there is, furthermore, an indication that the return of the tools can be controlled by cams or cam plates but without positive information on how this has to be done and whether it has an influence on the vibration behaviour.

The disadvantages mentioned are particularly serious in the case of machines for punching and shaping the lead-outs of integrated circuits because this work must, on the one hand, be carried out with great accuracy, particularly in the case of printed circuits which have many lead-outs because of a high integration density. On the other hand, a rapid working cycle is desirable for low-cost manufacture but factors opposing this are inertia, the tendency to vibration and an increase in wear. The tendency to vibration is particularly serious because the punching and shaping work on the delicate lead-outs can only be carried out with the desired precision if the integrated circuits sit quietly and the tools do not vibrate. These conditions must similarly be met if the machine tool is to be controlled and monitored by means of a camera for pattern recognition and pattern measuring devices. The integrated circuits which, initially, are still suspended with their lead-outs in pre-punched metal strips (so-called lead frames), tend to vibrate when the lead-outs are separated from the lead frame in one operational step and the integrated circuits are then further processed suspended in the lead frame on only four thin bridges.

DESCRIPTION OF THE INVENTION

The object of the present invention is so to arrange the tool driven in a machine tool of the type mentioned at the beginning, in particular in a machine for punching and shaping the lead-outs of integrated circuits, that the tendency to excite vibrations of the tool holder (clamping plate) and the frame is reduced and that a larger interval is achieved between the natural frequency of the machine parts and the components to be processed, on the one hand, and the main excitation frequency, on the other.

This object is achieved by means of a machine tool with the features given in claim 1. Advantageous further developments of the invention are the subject matter of the dependent claims.

In the machine according to the invention, the rollers of the two levers respectively run externally on an external cam track on the circumferential surface of at least one cam plate but the contact between the cam track and the roller is not ensured by mechanical preload by means of a spring but by the fact that each cam track is associated with a second cam track rigidly connected to it, the cam profile of this latter cam track being complementary to the first cam track, and that each of the two levers carries on one of its arms not only one freely rotating roller but two freely rotating rollers which are offset relative to one another in the peripheral direction of the cam track. Of these two rollers, one roller rolls on one cam track and the other rolls on the second cam track complementary to the first, this second cam track having a corresponding offset relative to the first cam track. Because of the complementary configuration of the cam tracks, it is possible—without preloading forces—to force the two rollers of a lever to have continuous contact with their cam track pair. The advantage of this arrangement is that for a given follower motion, the smallest possible cam plates can be used and, because of this, the inertia torque is low. It is also possible to keep the drive torques small because preloading springs are avoided. The vibration amplitude to which the machine is excited is correspondingly small.

The use of two rollers offset relative to one another in the selected arrangement for each lever has the great advantage that the forces occurring during acceleration and braking are no longer introduced exclusively parallel to the direction of motion of the tool in the machine frame but are divided into two directions. The acceleration forces during the return motion (idle stroke)—which are particularly critical to the excitation of vibrations—and the braking forces during the working stroke are deflected, in accordance with the invention, in a direction which is different from the direction (expediently coincident with the direction of the tool motion) of the acceleration forces during the working stroke. The tendency to excite vibration and also the vibration frequency are reduced by this division of the forces into different directions and this is particularly so in the preferred case in which the two rollers located on the second arm of the particular lever are located in a 90° position relative to one another and to the axis of the cam plates so that the forces occurring during the tool motion appear in two directions at right angles to one another, of which one is less important than the other with respect to the excitation of vibration in the tool region. It is expedient for the axes of the two rollers which produce the working stroke of the two tool halves to be located in a common plane parallel to the direction of motion of the tool halves, this plane also preferably containing the axis of the cam tracks. Although the acceleration forces during the working stroke and the braking forces during the idle stroke occur in the direction of the tool motion, the acceleration forces during the idle stroke and the braking forces during the working stroke are deflected in a direction extending at right angles to the previous one and cause hardly any vibration in the tool region. This applies quite particularly in the preferred case, in which the guide device for the tools, which is preferably a plate or a block—or a clamping plate carrying them—extends horizontally and in consequence, the tool motion also takes place horizontally and in which the two first rollers of the two levers are correspondingly supported in a plane parallel to the guide device or to the tool clamping plate and under the clamping plate; in this case, the second rollers of the levers introduce a substantial part of the forces downwards into the frame and into the machine foundation so that a resultant force directed obliquely relative to the tool motion is fed into the frame at the lever bearings during the acceleration phase in the idle stroke and during the braking phase 10 in the working stroke. The part of the forces which is introduced downwards into the frame and into the machine foundation causes less excitation of vibrations in the machine because of the large mass of the frame and the foundation. The machine is therefore characterised by smooth running which is an important advantage, given the high accuracy requirements of micro-engineering. Smooth running is also a condition for a higher working speed. In addition, smooth running means less wear and permits the use of a camera for pattern recognition and pattern measuring.

A further contribution to a low-vibration mode of operation is provided by the invention because the positions of the cam tracks are matched together in the direction of rotation in such a way that the acceleration phase of one tool half coincides with the deceleration phase of another tool half for at least some of the tool halves. A further advantage of this measure consists in the fact that the kinetic energy of the tool half to be braked can be utilised for driving another tool half and, in consequence, the force requirement for driving the machine can be reduced; this has the simultaneous advantage that an overload safety device in the drive train of the machine can be provided with a lower response threshold and, if necessary, the machine can be brought to rest more rapidly.

The measure employed—of matching the positions of the cam tracks to one another in a certain way—is particularly effective when it is used on tools located in sequence along the common axis of the cam tracks. These are then caused to operate one after the other instead of simultaneously and in such a way that in both groups of the tool halves which are located along the axis of the cam tracks, the position of the cam tracks belonging to the respective group is matched in such a way that both during the working stroke and during the idle stroke of the tools, the deceleration phase of one tool half coincides with the acceleration phase of the next tool half. In this way, forces occurring in the direction of the tool motion during the acceleration and braking of different work halves and forces occurring oblique to them can be super-imposed to give a resultant force which acts transversely, preferably at right angles, to the direction of the tool motion and is less effective in exciting vibration in the tool region so that the frequency and amplitude of the vibration excitation are further reduced.

It is, however, also useful to match the positions of the cam shapes on the cams belonging to one and the same tool in such a way that during the working stroke, the acceleration phase of the first tool half coincides with the deceleration phase of the second tool half whereas, during the idle stroke, the deceleration phase of the first tool half coincides with the acceleration phase of the second tool half. Although the excitation frequency cannot be further reduced by this means, it is possible to reduce the drive power and also the excitation amplitude.

A further reduction in the excitation frequency can be achieved if, instead of the above, the positions of the cam shapes of the associated cam plates are matched in such a way that during both the working stroke and the idle stoke, the acceleration phase of one of the tool halves coincides with the deceleration phase of the other tool half.

It is useful for the stationary part of the cam gear, on which the levers are supported, to be a tie-rod.

The tie-rod is preferably formed by the tool clamping plate itself. This has the advantage that the clamping plate is only subjected to tension. It is therefore not deformed during the press and printing operations but is, on the contrary, stretched by the tensile forces. This is very beneficial to precise support of the workpieces to be processed and to precise guidance of the tools, which is a substantial advantage in micro-engineering processing such as is necessary on micro-electronic components.

The fact that the lever is hinged near the tools, preferably directly at the clamping plate, has the further advantage that an optimally compact tool and gear arrangement is possible and this is further supported by the fact that in accordance with the invention, the second roller of each lever is located near the tools, preferably close below the clamping plate or even in a recess of the clamping plate. In consequence, the levers are very short and have low inertia.

In accordance with a further preferred feature of the invention, the second roller of each lever, which is located in the immediate vicinity of the tools or of the clamping plate, is smaller than the first roller. This is possible because it does not have to transmit the higher processing forces because these are transmitted from the two other first rollers located diametrically opposite to one another.

Because the second roller can be smaller, it is possible to bring the cam tracks closer to the clamping plate. This is associated with a corresponding shortening of the two levers which is again favourable with respect to reducing the inertia. The low inertia, in combination with the drive via complementary cam tracks, has the result that a smaller drive torque is sufficient for the acceleration. This is lower than the pure processing torque so that it is possible to provide an overload clutch in the drive train with a correspondingly lower response threshold. In addition, each reduction in the drive torques reduces the forces which can lead to the excitation of vibrations.

Clearance-free coupling between the lever which actuates the tools and the cam tracks is also of importance to low-vibration, precise operation of the tools. The drive of the tools by means of complementary cam tracks again proves satisfactory in this connection, each of the tracks being followed by two rollers offset relative to one another in the peripheral direction on one arm of a two-arm lever. Particularly small clearance in the coupling between the levers and the cam tracks is, in fact, achieved by a further development of the invention in accordance with which the arm of the lever carrying the rollers is branched into a main arm, which carries the first roller, and an auxiliary arm, which is weaker relative to the first roller and carries the second roller. The auxiliary arm can be made weak because it only has to transmit the forces necessary for the return of the tools (idle stroke) and these forces are very much less than the forces which the main arm has to transmit during the working stroke. Whereas the main arm has to be rigid, measured against the forces occurring, the auxiliary arm can be so weak relative to them that when the rollers are placed on the cam tracks with some pressure, it bends elastically. In this way, the rollers are kept in contact with the cam tracks with absolutely no clearance by using the spring-back of the weak auxiliary arm provided the position of the pivoting pin of the lever is selected relative to the cam plates in such a way that the rollers are continually in contact with the cam tracks under a slight contact pressure. As long as the rollers are in contact with the cam tracks without clearance, an additional vibration excitation due to cam clearance cannot occur and this is ensured for a longer period with an auxiliary arm of the lever which is weaker because in this case, the spring deflection of the sprung contact of the roller of the auxiliary arm becomes larger and a longer period therefore elapses before the lever has to be readjusted or replaced in order to avoid cam clearance.

The use of cam plates which are followed externally permits a further advantageous development of the invention which consists in the fact that at least the first rollers which transmit the forces during the working stroke—and preferably also the second rollers which transmit the forces during the idle stroke—are supported in their lever at both ends rather than just one. This makes the lever and roller arrangement particularly stiff and, in consequence, the actuation of the tools and the processing carried out by them becomes particularly precise.

In an advantageous further development of the invention, the levers are supported in bearing blocks which can be displaced parallel to the axis of the cam tracks, preferably along the clamping plate. By this means, the tool stations can be conveniently adjusted along the clamping plate; the cam plates are, of course, correspondingly displaceable along the shaft on which they are fastened. The levers can be removed, together with their bearing blocks, at right angles to their lateral clamping surface on the workpiece clamping plate for setting up and stripping down operations.

The idea of the invention can also be carried over to machine tools in which one movable tool half (punch) works against a fixed tool half (die) so that only one lever and one pair consisting of cam track and complementary cam track is required. Such a machine is the subject matter of the independent claim 2.

WAYS OF CARRYING OUT THE INVENTION

The attached drawings are used for further explanation of the invention.

Figure 1:
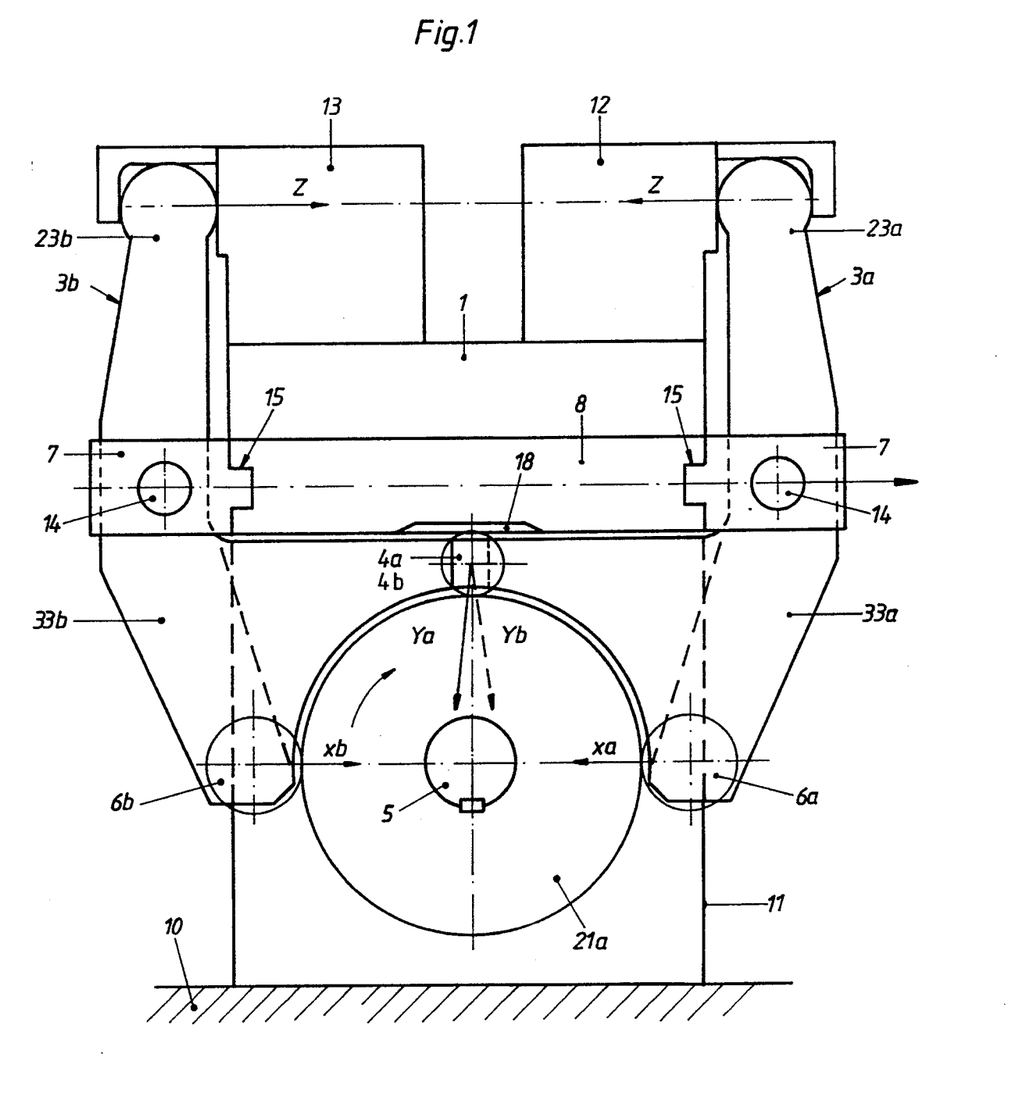
FIG. 1 shows, diagrammatically, the arrangement of a cam gear and a tool clamping plate with tool clamping device in a machine tool, viewed in the direction of the driving shaft of the cam gear.
Figure 2:
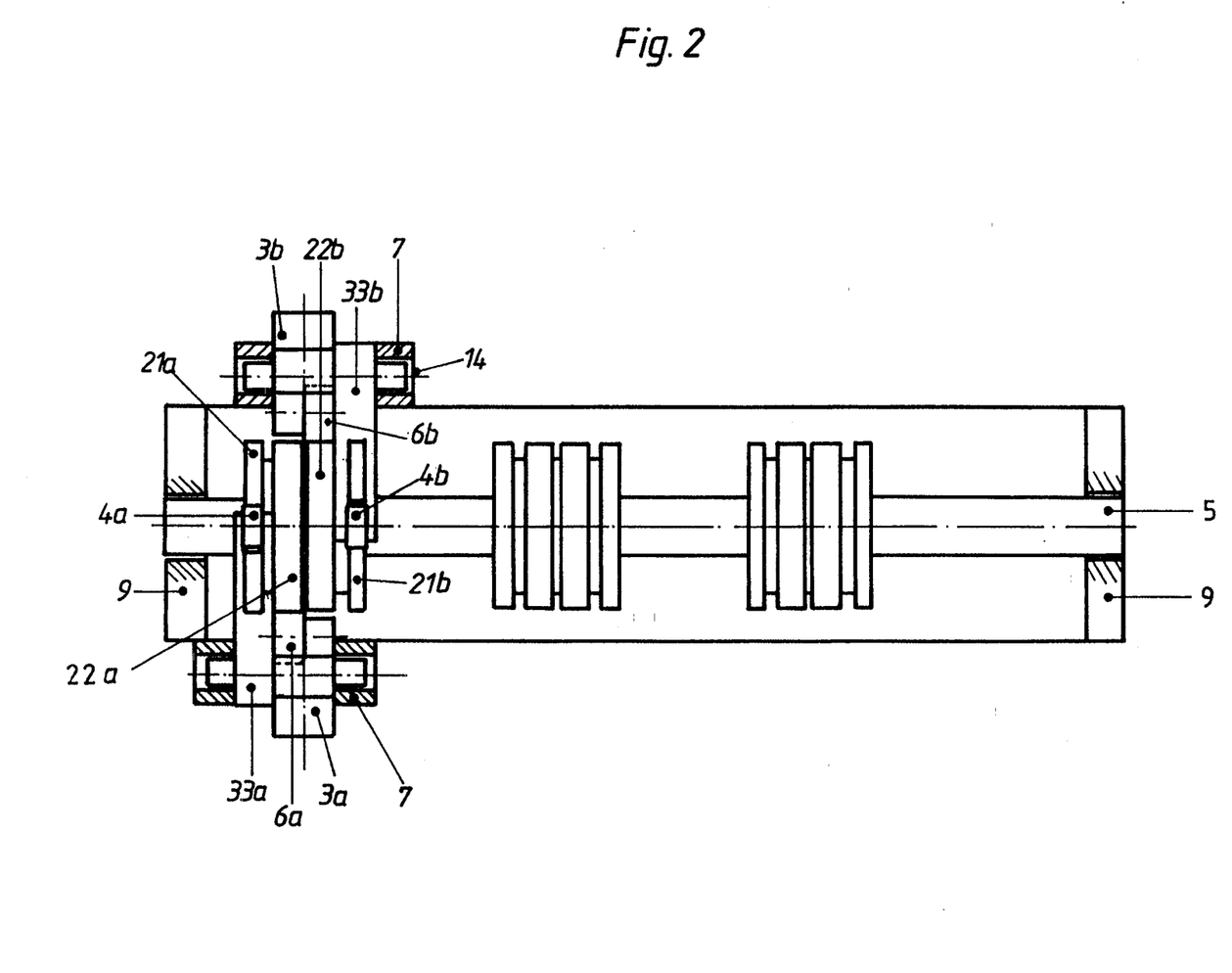
FIG. 2 shows, diagrammatically and partially in section, the plan view on the arrangement of FIG. 1 with the clamping plate removed.

The casing 11 of a cam gear, which is closed towards the top by a horizontal clamping plate 8, is attached to a machine frame 10. The processing tools are clamped on the clamping plate 8. The tools consist of two tool halves 12 and 13 operating against one another and which are guided oppositely and towards one another in the horizontal direction Z by the tool guide 1. In order to reciprocate them, two two-arm levers 3a and 3b act on them, these levers being supported in bearing blocks 7 so that they can be pivoted about horizontal pins 14. These bearing blocks 7 are connected to the clamping plate 8 by a groove and key connection 15 and can be displaced in their longitudinal direction. The respective upper arms 23a and 23b of the levers are connected to the tool halves 12 and 13. The lower arms 33a and 33b of the levers each branch into two sections which respectively carry at their ends a first larger roller 6a or 6b and a smaller roller 4a or 4b which are in contact with cam tracks which are formed on the end surface of cam plates. The cam plates are fastened to a common shaft 5 centrally located below the clamping plate 8. The roller 6a is in contact with a cam plate 22a, the roller 6b is in contact with a cam plate 22b, the roller 4a is in contact with a cam plate 21a and the roller 4b is in contact with a cam plate 21b. These four cam plates could also be replaced by a single cam plate with four cam tracks configured on its circumferential surface. The rollers 4a and 4b are located directly below the clamping plate 8 and protrude partially into a recess 18 of the clamping plate; relative to the shaft 5, they are also located in an approximately 90° position with respect to the rollers 6a and 6b which are located diametrically opposite to one another approximately at the level of the shaft 5. The cam track of the cam plate 21a is complementary to the cam track of the cam plate 22a and is offset relative to the latter by approximately 90° in the peripheral direction. The cam plate 21b has, correspondingly, a cam track which is complementary to the cam track of the cam plate 22b and is offset relative to the latter by approximately 90° in the peripheral direction. Because of the type of arrangement selected, the rollers 4a, 4b and 6a, 6b are guided practically without clearance on the cam tracks 21a, 21b, 22a and 22b and the levers 3a and 3b are optimally short.

So that several processes can be carried out simultaneously in the machine tool, three tool positions are provided and, in other embodiment examples, more than three tool positions can also be provided; there are, correspondingly, three groups of cam plates on the shaft 5 supported in the casing walls 9 and these are preferably displaceable on the shaft 5 (FIG. 2). The first group of cam plates contains, from left to right, the cam plates 21a, 22a, 22b, 21b, the second group contains the cam plates 21a', 22a', 22b' and 21b' and the third group contains the cam plates 21a'', 22a'', 22b'' and 21b''.

The levers 3a and 3b are similar and are symmetrically arranged opposite to one another. The two rollers 4a and 6a (or 4b and 6b) of each lever 3a (or 3b) provide, by interaction with the bearing support of the lever on its pin 14, a positive connection to the respective cam plate pair 21a and 22a or 21b and 22b.

In order to keep the inertia torque (and therefore the inertia forces) due to the levers 3a and 3b small during acceleration, the levers are made as short as possible, the lower arms 33a and 33b of the two levers being arranged as close as possible below the clamping plate 8 and the rollers 4a and 4b being made small—in any event smaller than the rollers 6a and 6b which have to transmit the processing forces. The small rollers 4a and 4b are only subject to the loads due to the inertia forces of the lever 3a or 3b occurring during the acceleration and the reduced mass of the moving parts of the tool suspended from it. Because of the arrangement of the rollers 4a and 4b vertically above the shaft 5, the acceleration forces accepted by them, which depend on the cam rise angle, are introduced substantially vertically into the machine frame and on into the ground. Because of the large frame mass involved and the good damping of the masses at the bottom, the acceleration amplitude is greatly reduced and the machine is therefore no longer so strongly excited to vibration. On the contrary, it runs very much smoother which leads, on the one hand, to less wear and, on the other, to increased precision during operation because the workpieces and the tools are seated more statically. The support for the operating forces in the tools is undertaken by the rollers 6a and 6b via the closely adjacent cam plates 22a and 22b which are wider than the complementary cam plates 21a and 21b. With respect to the operating forces, there is a closed force path from the workpiece via the tool half 12, the lever 3a, the roller 6a, the cam plates 22a and 22b, the roller 6b, the lever 3b and the tool half 13 back to the workpiece. The clamping plate 8 is loaded in tension only via the pivoting pins 14 of the levers and is not subject to any deformation.

Figure 3:
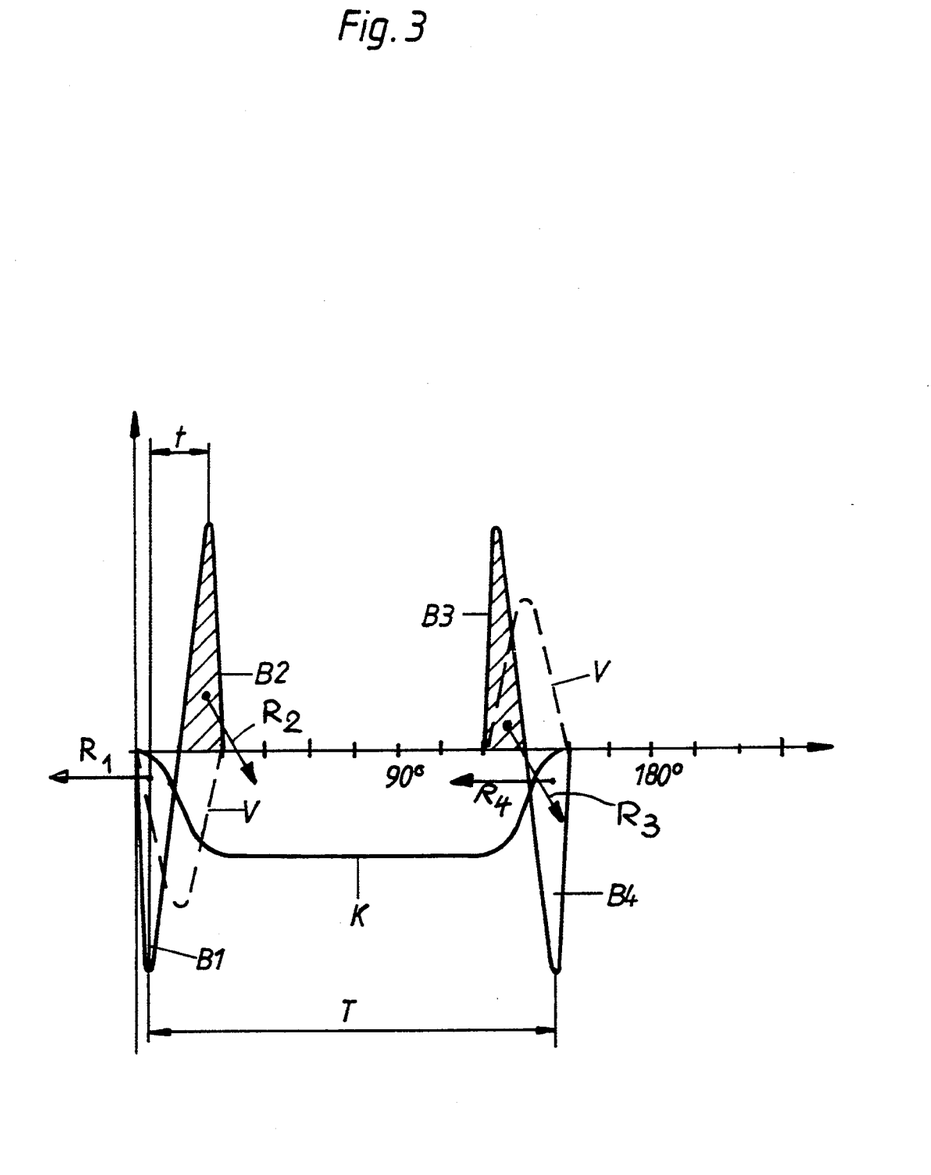
FIG. 3 shows an acceleration diagram.

Using the example of a cam shape K extending over a peripheral angle of 150°, FIG. 3 shows, diagrammatically, the variation with time of the velocity V and the acceleration B on a lever between the cam plate and the tool and also, by means of arrows, indicates the direction of the resultant forces occurring at the pin 14 of the lever during the particular phase. When a tool half is driven in the direction Z onto a workpiece, the large roller 6a or 6b experiences an acceleration B1 but the braking of the driving-in motion is undertaken by the small roller 4a or 4b and it then experiences the deceleration B2. During the return motion of the tool, in contrast, the smaller roller 4a or 4b is first loaded and experiences the acceleration B3 whereas the braking of the return motion takes place by means of the larger roller 6a or 6b and this experiences the deceleration B4. Because the smaller roller 4a or 4b introduces the acceleration forces approximately vertically downwards (direction Ya or Yb in FIG. 1) via the frame 10 into the ground and, by this means, makes them almost harmless, only the acceleration forces which are transmitted by the large roller 6a and 6b have to be taken into consideration for vibration excitation in the plane of the clamping plate 8. The time base for the vibration excitation is provided by the time interval between the maxima of B1 and B4. If, however, as in the present state of the art, the smaller rollers 4a and 4b were not present, the acceleration forces accepted by them must also be accepted and transmitted by the rollers 6a and 6b; they would then also contribute to vibration excitation in the plane of the clamping plate 8 and, in fact, with a time base corresponding to the distance between the maxima of B1 and B2 and of B3 and B4, which is very much smaller than the distance between the maxima of B1 and B4. In consequence, the excitation frequencies according to the invention are lower by a multiple than the excitation frequencies of the present state of the art, which is very desirable.

Figure 6:
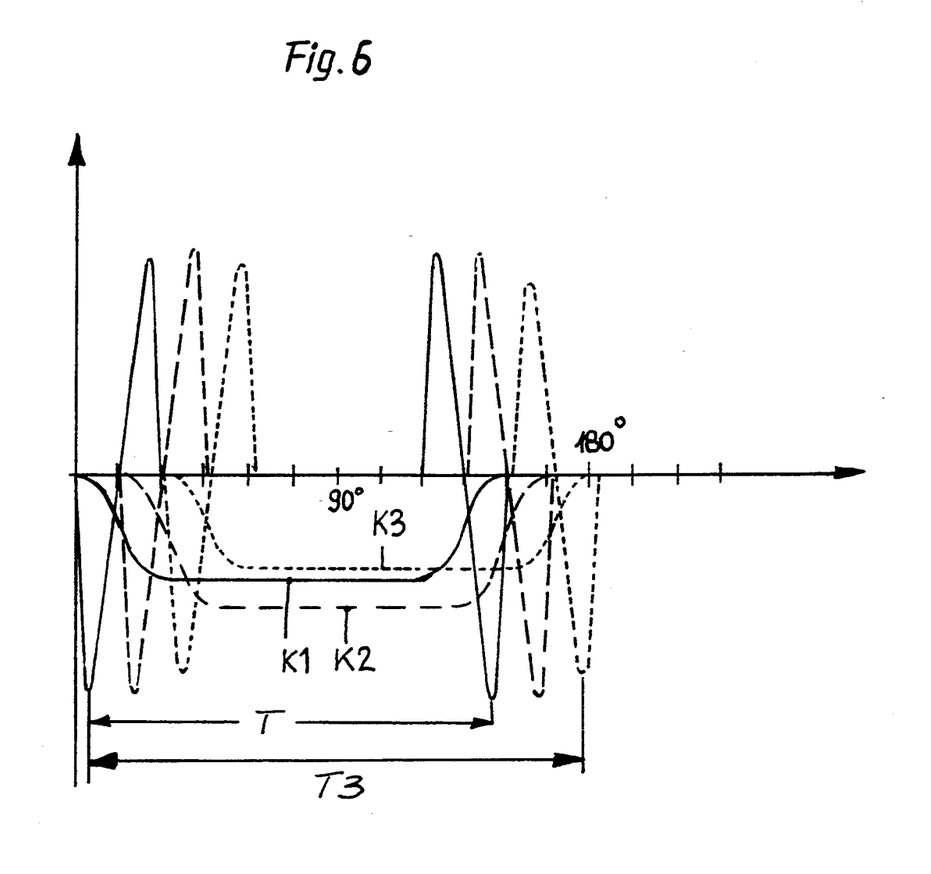
FIG. 6 shows an acceleration diagram, as in FIG. 3, but for three tools arranged one behind the other.

In the groups of cam plates belonging to the three different tools (see FIG. 2), the positions of the cam shapes are matched to one another in such a way that the tools carry out their working strokes with a time offset. This is shown diagrammatically in FIG. 6, for example, for the group of cam plates 22a, 22' and 22a''. The representation in FIG. 6 is built up in a corresponding manner to that of FIG. 3. K1 represents the cam shape on the cam plate 22a, K2 the cam shape on the cam plate 22a' and K3 the cam shape on the cam plate 22a''. In order to differentiate the shapes, K1 is represented by a full line, K2 by an interrupted line and K3 by a dotted line. The accelerations occurring during the acceleration and braking of the associated tool halves are correspondingly indicated by full, interrupted and dotted lines. If only the cam shape K1 were present or if the cam shapes K1, K2 and K3 were coincident, then, as in the example of FIG. 3, the period T of the vibrations excited in the direction of motion of the tool (with the main excitation frequency 1/T) would be determined by the distance between the acceleration maximum during the working stroke and the deceleration maximum during the idle stroke. If, however, as shown for the working stroke, the acceleration phase initiated by K2 coincides with the deceleration phase initiated by K1 and the acceleration phase initiated by K3 coincides with the deceleration phase by K2 and if, during the idle stroke, the acceleration phase initiated by K2 coincides with the deceleration phase initiated by K1 and the acceleration phase initiated by K3 coincides with the deceleration phase initiated by K2, the following forces are superimposed on one another:

$R_2$ due to the cam shape K1 with $R_1$ due to the cam shape K2, $R_2$ due to the cam shape K2 with $R_1$ due to the cam shape K3, $R_4$ due to the cam shape K1 with $R_3$ due to the cam shape K2, $R_4$ due to the cam shape K2 with $R_3$ due to the cam shape K3.

Figure 8:
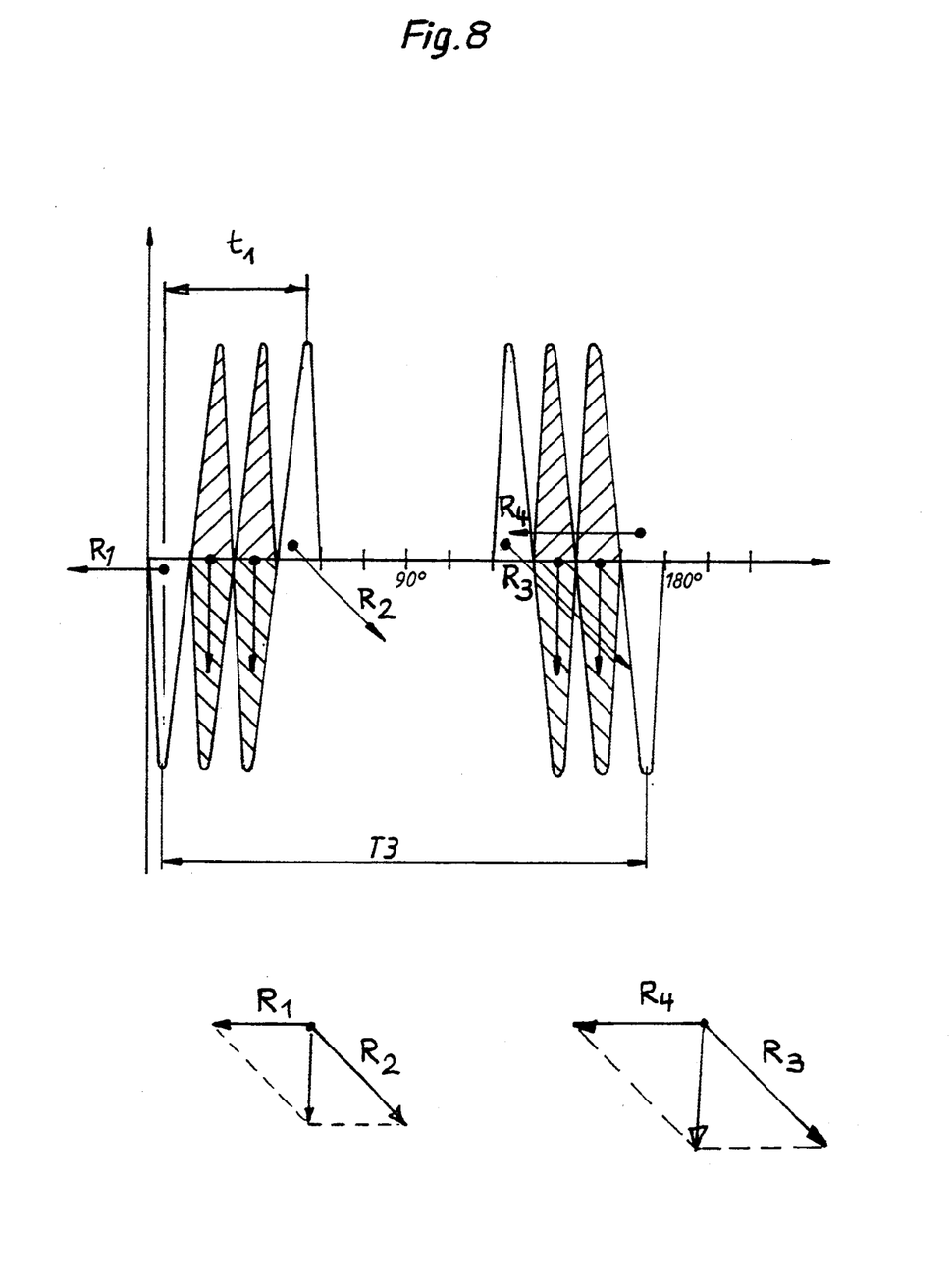
FIG. 8 shows an acceleration diagram, as in FIG. 6, with information on the directions of the acceleration forces.

Superimposing in this way gives resultant forces which are directly substantially downwards (see FIG. 8) and are therefore practically irrelevant to the excitation of vibration—much less even than the residual oblique resultant forces $R_2$ (in the braking phase of the working stroke of K3) and $R_3$ (in the acceleration phase of the idle stroke of K1). What remains for effective excitation of vibration in the direction of motion of the tools is, in the main, the load peaks due to the acceleration initiated by the working stroke of K1 and due to the deceleration initiated by the idle stroke of K3; their distance apart T3, which determines the period of the vibration excitation, is larger than T so that the excitation frequency is correspondingly lower in a desirable manner. Depending on the number of tools and the design of the cam plates, the excitation frequency can be reduced by as much as a half in this way.

The matching of the positions of the cam tracks in the tool groups, in accordance with the invention, has the additional effect that the time period between the acceleration phase during the working stroke of K1 and the appearance of the next obliquely extending resultant $R_2$ is increased to $t_1$ and the vibration excitation resulting from this is displaced to a less effective lower frequency.

Figure 7:
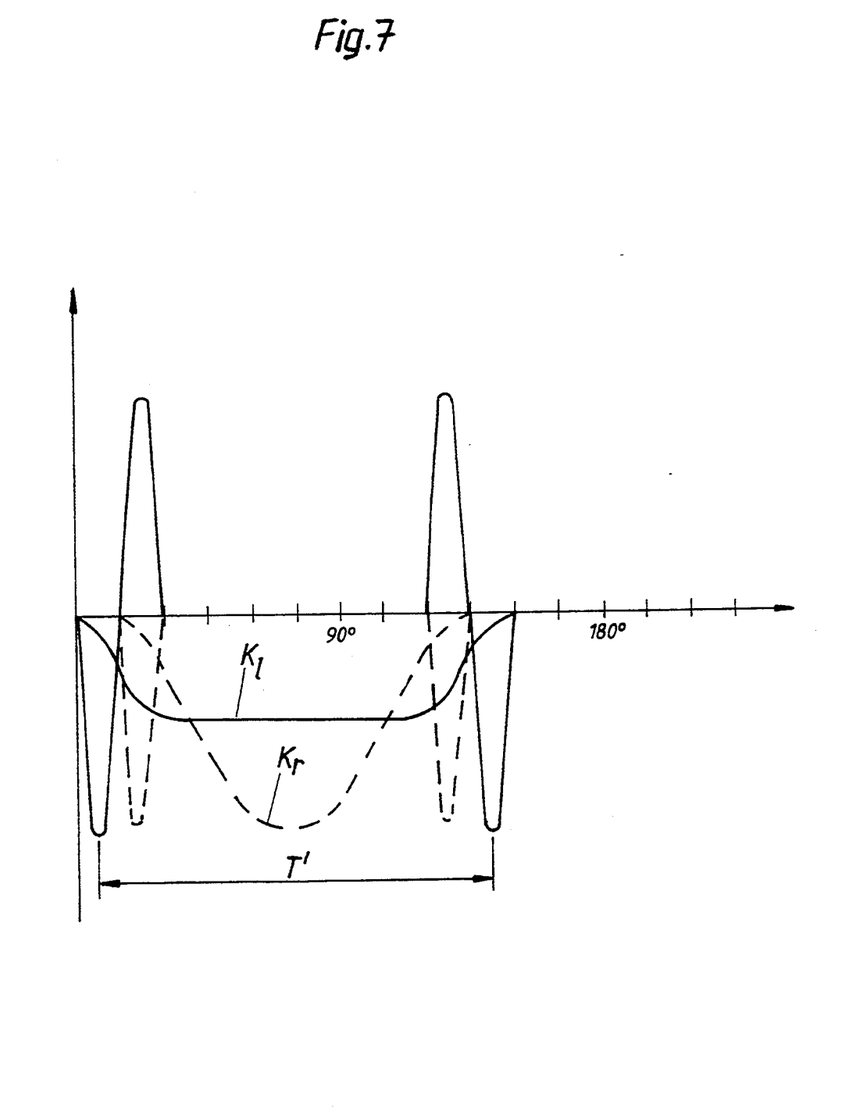
FIG. 7 shows an acceleration diagram, as in FIG. 3, but for two cam plates which are associated, in two halves, with one and the same tool.

FIG. 7 shows an example of how two cam plates associated with the two tool halves of one and the same tool are advantageously matched to one another with respect to the position of their cams. These can, for example, be the cam plates 22a and 22b, the cam shape $K_r$ being associated with the cam plate 22a and the cam shape $K_1$ being associated with the cam plate 22b. The tool half moved by the cam plate 22b is a die and the tool half moved by the cam plate 22a is a punch which operates against the die. The shapes $K_1$ and $K_r$ are matched to one another in such a way that during the working stroke, the die is accelerated first; the punch is then accelerated while the die is already being decelerated so that the die, and with it a workpiece (integrated circuit) supported by the die, are already at rest before the punch arrives. When the tool is opened (idle stroke), the reverse occurs. In this case, the punch is accelerated first; the die is then accelerated while the punch is already being braked. By this means, the kinetic energy of the tool half being braked can be used to accelerate the other tool half. The period T' for a possible vibration excitation in the direction of motion of the tool is mainly determined by the distance between the acceleration maximum of the die during the working stroke and the deceleration maximum of the die during the idle stroke.

It should also be pointed out, as may be seen from FIG. 1, that in the arrangement selected for the small rollers 4a and 4b—located centrally above the cam plate and close beneath the clamping plate 8—the sideways removal of the levers 3a and 3b at right angles to the clamping surface of the bearing blocks 7 is easily possible, thus ensuring good accessibility to the cam gear and facilitating its adjustment.

Figure 4:
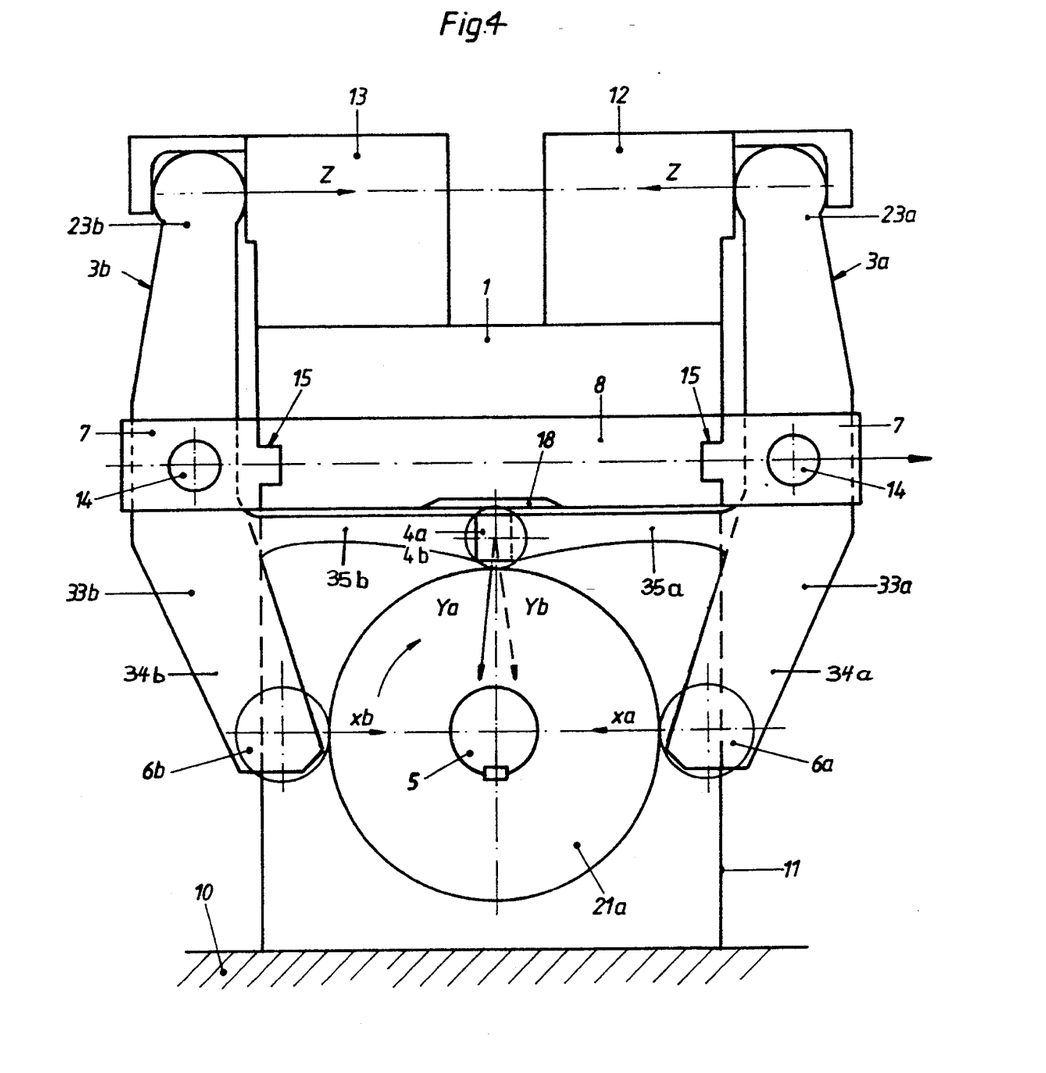
FIG. 4 shows an arrangement as in FIG. 1 but with a modified lever configuration.

The embodiment example of FIG. 4 differs from that in FIG. 1 in that the arms 33a and 33b of the levers 3a and 3b are branched into a strong main arm 34a or 34b and into an auxiliary arm 35a or 35b which is substantially weaker relative to the main arm 34a or 34b. Each of the main arms 34a or 34b carries the first roller 6a or 6b for transmitting the forces during the working stroke. Each of the auxiliary arms 35a and 35b carries the smaller roller 4a or 4b for transmitting the forces during the idle stroke. Because the auxiliary arm is very much weaker than the main arm, the auxiliary arm 35a or 36a can spring back somewhat when the two rollers 6a and 4a or 6b and 4b are run on their cam plates under some pressure. Because of the small spring deflection of the auxiliary arm, which does not substantially increase the driving torque, absolutely clearance-free coupling between the cam plates 21a, 21b, 22a, 22b and the rollers 6a,6b, 4a, 4b is achieved.

Figure 5:
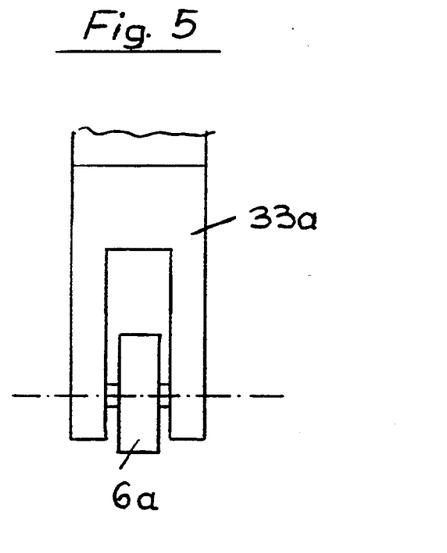
FIG. 5 shows, as detail, the support of a roller in its lever at both ends.

As is shown in FIG. 5, it is useful for the main arm 34a or 34b to be configured in fork-shape and to support the roller 6a or 6b at both ends so that the arrangement made up of lever 3a or 3b and roller 6a or 6b is extremely stiff.

In the embodiment example of FIG. 1 or FIG. 4, one of the tool halves, for example the tool half 13, can be stationary. The lever 3b and the associated cam plates 21b and 22b are then omitted and matching of the position of the cam tracks in accordance with the invention is only possible between cam tracks which are associated with different groups of tools. This machine also runs very smoothly even though the shaft 5 is loaded on one side only in the region of the particular tool group.

Commercial application

The invention is particularly suitable for machine tools for the punching and shaping of the lead-outs of integrated circuits which are supplied to the machine tool supported in a metallic carrier strip (lead frame).

We claim:

1. Machine tool with tools for carrying out punching, cutting, embossing and shaping work, in particular for punching and shaping the lead-outs of integrated circuits, having a frame (10), having a cam gear, supported-in the frame (10), with several pairs of coaxially arranged cam tracks on the circumferential surface of one or a plurality of cam plates (22a, 22b) for driving the tools along a guide surface (1), each tool having two tool halves (12, 13) for whose actuation two pivotably supported two-arm levers (3a, 3b) are provided on a stationary part (8) of the cam gear, which levers (3a, 3b) are connected at their first arm (23a, 23b) to the tool halves (12, 13) and carry on their second arm (33a, 33b) a freely rotating roller (6a,6b), of which one (6a) is in contact with a cam track (on 22a) and the other (6a) is in contact with the other cam track (on 22b) of a cam track pair, characterised in that cam track pairs are provided which consist of a first cam track (on 22a, 22b) and of a further cam track (on 21a, 21b) which is rigidly connected to it, has a cam shape complementary to it and is offset relative to it in the direction of rotation and that the two levers (3a, 3b) additionally carry on their second arm (33a, 33b) a second, freely rotating roller (4a, 4b) which is in contact, with a corresponding offset, with the complementary cam track on the peripheral area of a cam plate (21a, 21b) and that the positions of the cam tracks (on 22a, 22b, 21a, 21b) in the direction of rotation are matched to one another in such a way that it is true for at least some of the tool halves (12, 13) that the acceleration phase of one tool half coincides with the deceleration phase of another tool half.

2. Machine tool with tools for carrying out punching, cutting, embossing and shaping work, in particular for punching and shaping the lead-outs of integrated circuits, having a frame (10), having a cam gear, supported in the frame (10), with several pairs of coaxially arranged cam tracks on the circumferential surface of one or a plurality of cam plates (22a, 22b) for driving the tools along a guide surface (1), each tool having two tool halves (12, 13), of which one is stationary and a two-arm lever (3a, 3b) is provided for actuating the other, which lever (3a, 3b) is pivotably supported on a stationary part (8) of the cam gear, is connected at its first arm (23a, 23b) to the movable tool half (12, 13) and carries on its second arm (33a, 33b) a freely rotating roller (6a,6b) which is in contact with the cam track (on 22a, 22b) associated with the respective tool, characterised in that cam track pairs are provided which consist of a first cam track (on 22a, 22b) and of a further cam track (on 21a, 21b) which is rigidly connected to it, has a cam shape complementary to it and is offset relative to it in the direction of rotation and that the lever (3a, 3b) additionally carries on its second arm (33a, 33b) a second, freely rotating roller (4a, 4b) which is in contact, with a corresponding offset, with the complementary cam track on the peripheral area of a cam plate (21a, 21b) and that the positions of the cam tracks (on 22a, 22b, 21a, 21b), which are associated with different tools, in the direction of rotation are matched to one another in such a way that it is true for at least some of the tool halves (12, 13) that the acceleration phase of one tool half in one tool coincides with the deceleration phase of another tool half in another tool.

3. Machine according to claim 1, characterised in that in the two groups of tool halves which are arranged one after the other along the axis (5) of the cam plates (21a, 21a', 21a''; 21b, 21b', 21b''; 22a, 22a', 22a''; 22b, 22b', 22b''), the position of the tracks of the cam plates associated with the respective group is matched in such a way that both during the working stroke and during the idle stroke of the tools, the deceleration phase of one tool half coincides with the acceleration phase of the tool half which follows next.

4. Machine according to claim 1, characterised in that for the two halves (12, 13) of a tool, the position of the tracks of the respective cam plates (22a, 22b) is so matched that during the working stroke, the acceleration phase of the first tool half (13) coincides with the deceleration phase of the second tool half (12), whereas during the idle stroke, the deceleration phase of the first tool half (13) coincides with the acceleration phase of the second tool half (12).

5. Machine according to claim 1, characterised in that for the two halves (12, 13) of a tool, the position of the respective cam tracks (on 21a, 21b; 22a, 22b) is matched in such a way that during both the working stroke and the idle stroke, the acceleration phase of one of the tool halves coincides with the deceleration phase of the other tool half.

6. Machine according to claim 1, characterised in that the axes of the second rollers (4a, 4b) are located approximately on a normal to the direction of motion Z of the tool halves (12, 13), the normal passing through the axis of the cam tracks (on 21a, 21b, 22a, 22b) and axes being located near the tool halves (12, 13).

7. Machine according to claim 1, characterised in that the stationary part (8) of the cam drive is preferably a tie-rod fixed relative to the frame.

8. Machine according to claim 1, characterised in that the guide device (1) for the tools extends between the latter and the cam tracks (on 21a, 22a, 21b, 22b) and the second roller(s) (4a,4b) is (are) located close below the guide device (1) or a tool clamping plate (8).

9. Machine according to claim 1, characterised in that the second roller(s) (4a, 4b) is (are) located on the axis of the cam tracks (on 21a, 21b, 22a, 22b) at a 90° position relative to the first roller (6a,6b).

10. Machine according to claim 1, characterised in that the second roller (4a, 4b) is smaller in diameter than the first roller (6a, 6b).

11. Machine according to claim 1, characterised in that the clamping plate (8) is the tie-rod on which the levers (3a, 3b) are pivotably supported.

12. Machine according to claims 8, characterised in that the clamping plate (8) extends horizontally.

13. Machine according to claim 1, characterised in that the second rollers (4a, 4b) are immediately adjacent to the clamping plate (8).

14. Machine according to claim 1, characterised in that the clamping plate (8) has a recess (18) into which the second rollers (4a, 4b) protrude.

15. Machine according to claim 1, characterised in that the levers (3a, 3b) are supported in bearing blocks (7) which can be displaced parallel to the axis of the cam tracks (on 21a, 21b, 22a, 22b), in particular along the clamping plate (8).

16. Machine according to claim 1, characterised in that the arm (33a, 33b), of the lever (3a, 3b), carrying the rollers (6a, 6b, 4a, 4b) is branched into a main arm (3a, 3b) carrying the first roller (6a, 6b) and a second auxiliary arm (35a, 35b) which carries the second roller (4a, 4b) and is weaker than the first arm.

17. Machine according to claim 16, characterised in that the rollers (6a, 6b, 4a, 4b) are in contact without clearance on the cam tracks (on 21a, 21b, 22a, 22b) by means of pressure.

18. Machine according to claim 1, characterised in that at least the first rollers (6a,6b), and preferably also the second rollers (4a, 4b), are supported in their lever (3a, 3b) at both ends.

19. Machine according to claim 1, characterised in that the two rollers (6a,6b) are located approximately diametrically relative to the respective cam track pair and with their axes in a plane extending approximately parallel to the direction of motion (Z) of the tools.

20. Machine according to claim 2, characterised in that in the two groups of tool halves which are arranged one after the other along the axis (5) of the cam plates (21a, 21a', 21a''; 21b, 21b', 21b''; 22a, 22a', 22a'', 22b, 22b', 22b''), the position of the tracks of the cam plates associated with the respective group is matched in such a way that both during the working stroke and during the idle stroke of the tools, the deceleration phase of one tool half coincides with the acceleration phase of the tool half which follow next.

21. Machine according to claim 3, characterised in that for the two halves (12, 13) of a tool, the position of the tracks of the respective cam plates (22a, 22b) is so matched that during the working stroke, the acceleration phase of the first tool half (13) coincides with the deceleration phase of the second tool half (12), whereas during the idle stroke, the deceleration phase of the first tool half (13) coincides with the acceleration phase of the second tool half (12).

22. Machine according to claim 3, characterised in that for the two halves (12, 13) of a tool, the position of the respective cam tracks (on 21a; 22a, 22b) is matched in such a way that during both the working stroke and the idle stroke, the acceleration phase of one of the tool halves coincides with the deceleration phase of the other tool half.

23. Machine according to claim 2, characterised in that the axes of the second roller (4a, 4b) are located approximately on a normal to the direction of motion Z of the tool halves (12, 13), the normal passing through the axis of the cam tracks (on 21a, 21b, 22a, 22b) and axes being located near the tool halves (12, 13).

24. Machine according to claim 2, characterised in that the stationary part (8) of the cam drive is preferably a tie-rod fixed relative to the frame.

25. Machine according to claim 2, characterised in that the guide device (1) for the tools extends between the latter and the cam tracks (on 21a, 22a, 21b, 22b) and the second roller (s) (4a, 4b) is (are) located close below the guide device (1) or a tool clamping plate (8).

26. Machine according to claim 2, characterised in that the second roller (s) (4a, 4b) is (are) located on the axis of the cam tracks (on 21a, 21b, 22a, 22b) at a 90° position relative to the first roller (6a,6b).

27. Machine according to claim 2, characterised in that the second roller (4a, 4b) is smaller in diameter than the first roller (6a,6b).

28. Machine according to claim 2, characterised in that the clamping plate (8) is the tie-rod on which the levers (3a, 3b) are pivotably supported.

29. Machine according to claim 28, characterised in that the clamping plate (8) extends horizontally.

30. Machine according to claim 2, characterised in that the second rollers (4a, 4b) are immediately adjacent to the clamping plate (8).

31. Machine according to claim 2, characterised in that the clamping plate (8) has a recess (18) into which the second rollers (4a, 4b) protrude.

32. Machine according to claim 2, characterised in that the levers (3a, 3b) are supported in bearing blocks (7) which can be displaced parallel to the axis of the cam tracks (on 21a, 21b, 22a, 22b), in particular along the clamping plate (8).

33. Machine according to claim 2, characterised in that the arm (33a, 33b), of the lever (3a, 3b), carrying the rollers (6a, 6b, 4a, 4b) is branched into a main arm (3a, 3b) carrying the first roller (6a,6b) and a second auxiliary arm (35a, 35b) which carries the second roller (4a, 4b) and is weaker than the first arm.

34. Machine according to claim 33, characterised in that the rollers (6a, 6b, 4a, 4b) are in contact without clearance on the cam tracks (on 21a, 21b, 22a, 22b) by means of pressure.

35. Machine according to claim 2, characterised in that at least the first roller (6a,6b), and preferably also the second rollers (4a, 4b), are supported in their lever (3a, 3b) at both ends.

36. Machine according to claim 2, characterised in that the two rollers (6a,6b) are located approximately diametrically relative to the respective cam track pair and with their axes in a plane extending approximately parallel to the direction of motion (Z) of the tools.

37. Machine according to claim 6, characterised in that the second roller(s) (4a, 4b) is (are) located on the axis of the cam tracks (on 21a, 21b, 22a, 22b) at a 90° position relative to the first roller (6a, 6b).

38. Machine according to claim 23, characterised in that the second roller(s) (4a, 4b) is (are) located on the axis of the cam tracks (on 21a, 21b, 22a, 22b) at a 90° position relative to the first roller (6a, 6b).

39. Machine according to claim 37, characterised in that the second roller (4a, 4b) is smaller in diameter than the first roller (6a, 6b).

40. Machine according to claim 38, characterised in that the second roller (4a, 4b) is smaller in diameter than the first roller (6a, 6b).

41. Machine according to claim 39, characterised in that the clamping plate (8) has a recess (18) into which the second rollers (4a, 4b) protrude.

42. Machine according to claim 40, characterised in that the clamping plate (8) has a recess (18) into which the second rollers (4a, 4b) protrude.

* * * * *